(12) United States Patent
Ao

(10) Patent No.: US 11,470,751 B2
(45) Date of Patent: Oct. 11, 2022

(54) COMPONENT-MOUNTING SYSTEM AND MANAGEMENT DEVICE

(71) Applicant: FUJI CORPORATION, Chiryu (JP)

(72) Inventor: Hiroyuki Ao, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 953 days.

(21) Appl. No.: 16/315,098

(22) PCT Filed: Jul. 8, 2016

(86) PCT No.: PCT/JP2016/070291
§ 371 (c)(1),
(2) Date: Jan. 3, 2019

(87) PCT Pub. No.: WO2018/008148
PCT Pub. Date: Jan. 11, 2018

(65) Prior Publication Data
US 2019/0313554 A1    Oct. 10, 2019

(51) Int. Cl.
*H05K 13/02* (2006.01)
*H05K 13/04* (2006.01)
*H05K 13/08* (2006.01)

(52) U.S. Cl.
CPC ........ *H05K 13/021* (2013.01); *H05K 13/0417* (2013.01); *H05K 13/0419* (2018.08); *H05K 13/086* (2018.08)

(58) Field of Classification Search
CPC ........................... H05K 13/021; H05K 13/086
See application file for complete search history.

(56) References Cited

U.S. PATENT DOCUMENTS 5,979,045 A * 11/1999 Nishimori ............ H05K 13/021
29/832

FOREIGN PATENT DOCUMENTS

WO    WO 2014/010084 A1    1/2014

OTHER PUBLICATIONS

International Search Report dated Oct. 11, 2016 in PCT/JP2016/070291 filed Jul. 8, 2016.

* cited by examiner

*Primary Examiner* — Saul Rodriguez
*Assistant Examiner* — Willie Berry, Jr.
(74) *Attorney, Agent, or Firm* — Oblon, McClelland, Maier & Neustadt, L.L.P.

(57) ABSTRACT

Component-mounting system includes multiple component mounting machines disposed along a board conveyance direction; feeder storage container for storing multiples of feeders, which are capable of being attached/detached to and from component mounting machines, in each stage among multiple stages; first feeder moving robot capable of exchanging feeder between the lowest stage among multiple stages of feeder storage container and component mounting machine; and second feeder moving robot capable of exchanging feeder between the lowest stage among multiple stages of feeder storage container and the other stages.

7 Claims, 14 Drawing Sheets

COMPONENT-MOUNTING SYSTEM AND MANAGEMENT DEVICE

TECHNICAL FIELD

The present application relates to a component-mounting system and a management device.

BACKGROUND ART

A component-mounting system has been known in which multiple component mounting machines for mounting components and a storage container for storing component supply units, such as tape feeders and component trays, are arranged along a mounting line. For example, Patent literature 1 discloses a component-mounting system including a component storage container (i.e., a unit storage container), multiple mounting modules (i.e., component mounting machines), and a component replenishing unit (i.e., unit moving device), being installed on a moving body that moves between the component storage container and the multiple mounting modules, which replenishes/collects component supply units to and from the mounting modules, so that the components are replenished automatically.

Prior Art Literature

Patent literature 1: WO2014/010084A1

BRIEF SUMMARY

Technical Problem

In order to cope with a large variety of small-volume productions requiring frequent replacement of component supply units, it is desirable to be able to store a large number of the component supply units in the unit storage container and efficiently replenish (i.e., replace) component supply units.

It is a main objective of the present disclosure to provide a high-productivity component-mounting system or a management device thereof which is suitable for multi-product small-volume production.

The present disclosure employs the following unit for achieving the above-mentioned main objective.

The component-mounting system of the present disclosure is a component-mounting system, comprising: multiple component mounting machines installed along the direction in which a mounting target object is conveyed, each component mounting machine mounting components supplied from component supply units to the mounting target object, and having a mounting section to which the component supply units are detachable; a unit storage container which is installed in the same line as that of the multiple component mounting machines being arranged, and has multiple stages of mounting units to which component supply units are detachable; a first unit moving device for exchanging the component supply units between the mounting section of a specific stage from among multiple stages of the unit storage container and the mounting section of each component mounting machine, and a second unit moving device for exchanging the component supply units between the mounting section of the specific stage of the unit storage container and the mounting section of a non-specific stage different from the specific stage.

The component-mounting system of the present disclosure includes the unit storage container which is arranged in the same line of the multiple component mounting machines being arranged, and has multiple stages of mounting sections to which component supply units can be detachable. As a result, the unit storage container can store a large number of component supply units over multiple stages. Further, the component-mounting system includes first and second unit moving devices, wherein the first unit moving device for exchanging the component supply units between the mounting section of the specific stage among multiple stages of the unit storage container and the mounting section of each component mounting machine, and the second unit moving device for exchanging the component supply units between the mounting section of the specific stage of the unit storage container and the mounting section of a non-specific stage different from the specific stage. As a result, the component supply units stored in a non-specific stage of the unit storage container can be supplied to the mounting section of each component mounting machine via the specific stage of the unit storage container. Therefore, it is possible to automatically supply and collect component supply units between the unit storage container capable of storing a large number of component supply units and the multiple component mounting machines, which provides a high-productivity component-mounting system suitable for a wide variety of small-scale productions.

In the component-mounting system of the present disclosure, the component-mounting system according to claim 1, wherein the second unit moving device mounts a component supply unit to be required for a subsequent production, onto the mounting section of the specific stage, the component supply unit being one of component supply units stored in the unit storage container, and wherein at a time of the subsequent production being performed, the first unit moving device replaces the component supply unit to be required for the subsequent production, which is mounted on the mounting section of the specific stage, with a used component supply unit which is mounted on the mounting section of the component mounting machine requiring the component supply unit to be required for the subsequent production. In this way, it is possible to perform changeover work efficiently.

Further, in the component-mounting system of the present disclosure, the second unit moving device controls a component supply unit among the component supply units stored in the unit storage container, such that the component supply unit, capable of supplying components of the same type as a component supply unit expected to be depleted of components, is mounted onto the mounting section of the specific stage, when any of the component supply units mounted on each mounting section of the multiple component mounting machines is expected to be depleted of components, while the first unit moving device, at the timing of component depletion, controls the component supply unit mounted on the mounting section of the specific stage such that the component supply unit is exchanged with the component supply unit, being mounted on a mounting section of any of the multiple component mounting machines, which is expected to be depleted of components. In this case, it is possible to efficiently replace the component supply unit in which components are expected to become depleted.

Further, in the component-mounting system of the present disclosure, the second unit moving device may cause a used component supply unit, among the component supply units stored in the unit storage container, to be mounted on the mounting section of the specific stage at a predetermined timing. This makes it possible to collect the used component supply units and replenish new component supply units collectively to a specific stage of the unit storage container by an operator or an automatic collection/replenishing device (AGV).

Further, the component-mounting system of the present disclosure may include a management device for linking and storing unit-related information obtained from the corresponding component mounting machine, the unit-related information including: mounting positional information relating to mounting positions of component supply units mounted on each mounting section of the multiple component mounting machines, component type information relating to types of components that are supplied by the component supply unit, and remaining quantity information relating to the number of components remaining in the component supply unit; and the management device links and stores unit-related information obtained from the unit storage container, the unit-related information including: mounting position information relating to mounting positions of component supply units mounted on each mounting section of the unit storage container, component type information relating to types of components that are supplied by the component supply unit, and remaining quantity information relating to the number of components remaining in the component supply unit. In this case, the management of all the component supply units can be performed collectively by the management device.

In this case, in the component-mounting system of the present disclosure, the management device may transmit a control command to the first unit moving device and the second unit moving device based on the unit-related information so that the component supply unit can be exchanged between the specific stage and the non-specific stage of the unit storage container, and can be also exchanged between the specific stage of the unit storage container and the multiple component mounting machines. This makes it possible to efficiently manage the replenishment and collection of component supply units to and from multiple component mounting machines with the management device.

The management device of the present disclosure is a management device for managing a component-mounting system, the component-mounting system comprising: multiple component mounting machines installed along the direction in which a mounting target object is conveyed, wherein each component mounting machine mounts components supplied from component supply units to the mounting target object, each component mounting machine having a mounting section to which the component supply units are detachable; a unit storage container which is installed in the same line as the multiple component mounting machines and has multiple stages of mounting units to which component supply units are detachable; a first unit moving device for exchanging the component supply units between the mounting section of a specific stage from among multiple stages of the unit storage container and the mounting section of each component mounting machine; and a second unit moving device for exchanging the component supply units between the mounting section of the specific stage of the unit storage container; wherein the management device links and stores unit-related information obtained from the corresponding component mounting machine, the unit-related information including: mounting positional information relating to mounting positions of component supply units mounted on each mounting section of the multiple component mounting machines, component type information relating to types of components that are supplied by the component supply unit, and remaining quantity information relating to the number of components remaining in the component supply unit: and the management device links and stores unit-related information obtained from the unit storage container, the unit-related information including: mounting position information relating to mounting positions of component supply units mounted on each mounting section of the unit storage container, component type information relating to types of components that are supplied by the component supply unit, and remaining quantity information relating to the number of components remaining in the component supply unit: and the management device transmits a control command to the first unit moving device and the second unit moving device so that the component supply unit is exchanged between the specific stage and the non-specific stage of the unit storage container based on the unit-related information and between the specific stage of the unit storage container and the multiple component mounting machines.

The management device of the present disclosure is configured to manage the entire component-mounting system of the present disclosure described above, obtains unit-related information from the unit storage container and the multiple component mounting machines and transmits control commands to the first unit moving device and the second unit moving device. Therefore, replenishment and collection of component supply units to the multiple component mounting machines can be efficiently managed by the management device.

DETAILED DESCRIPTION OF THE EMBODIMENTS

Figure 1:
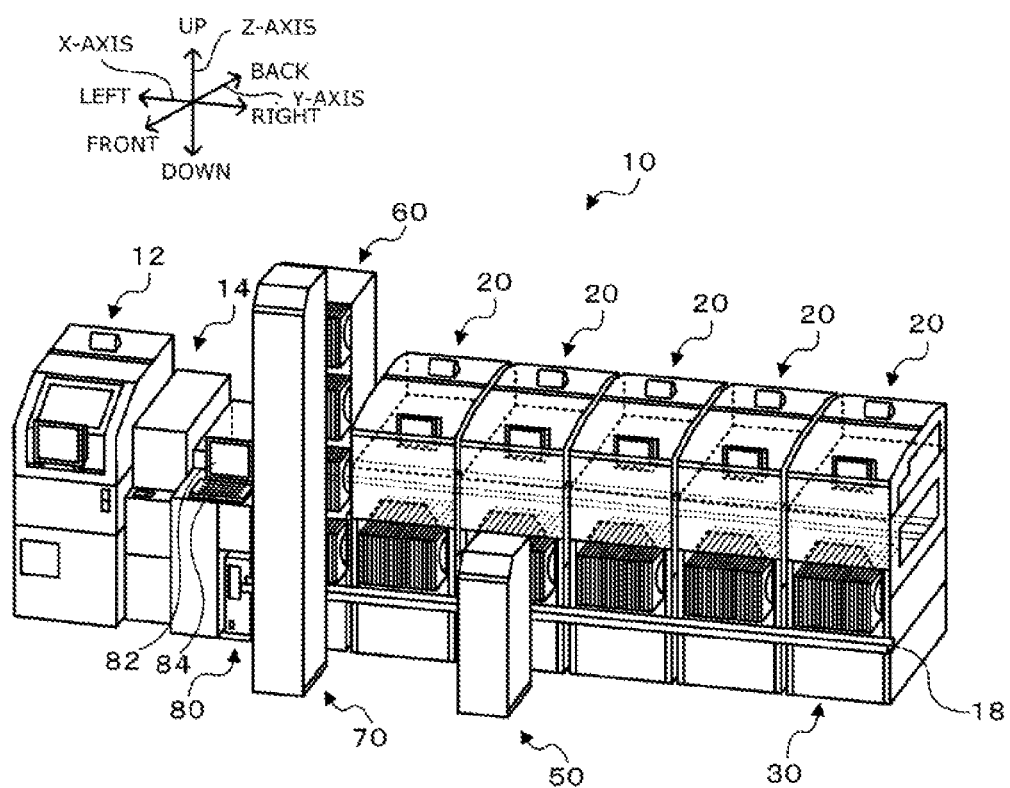
FIG. 1 is a diagram showing a schematic configuration of a component-mounting system 10.
Figure 2:
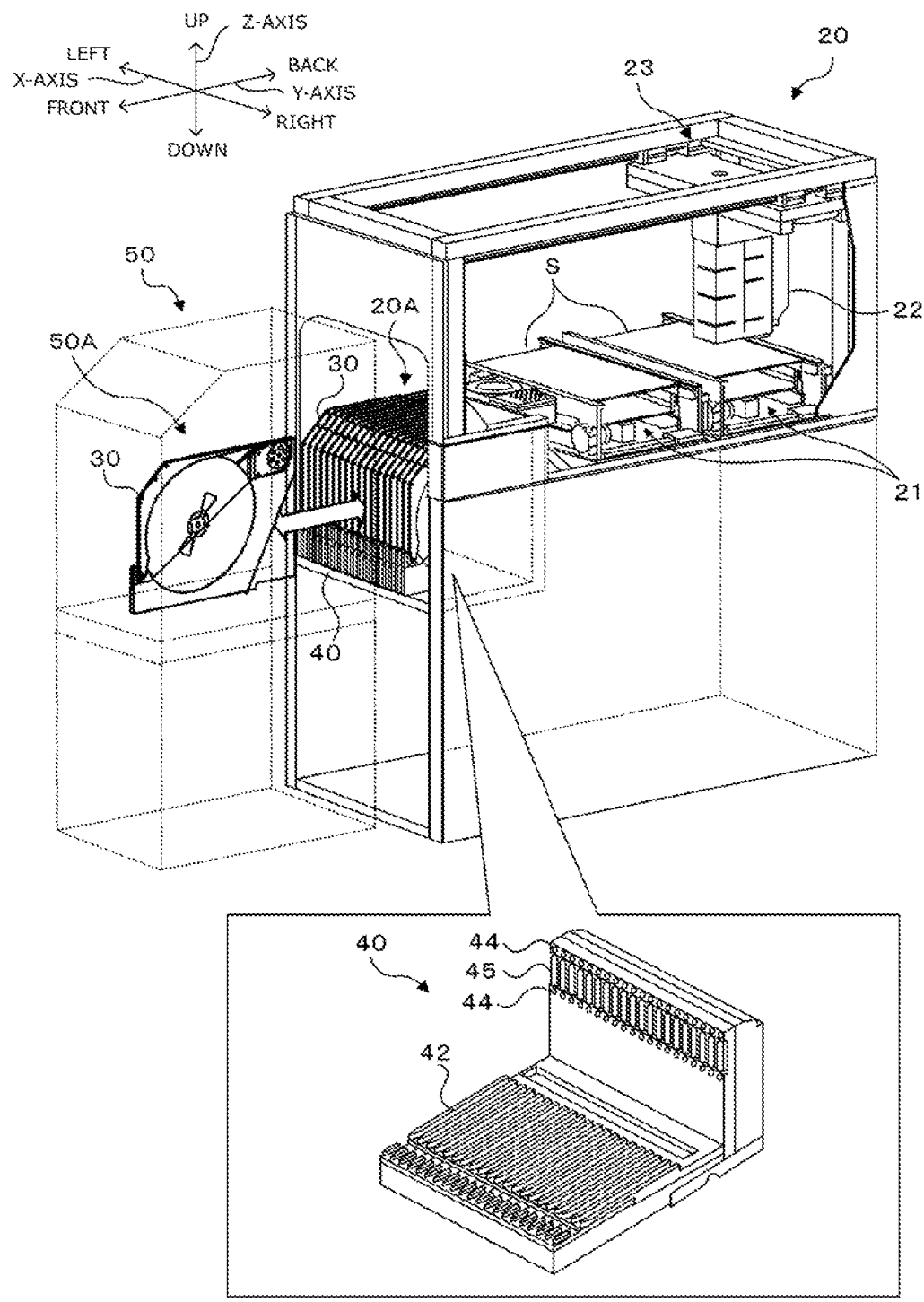
FIG. 2 is a diagram showing a schematic configuration of a component mounting machine 20.
Figure 3:
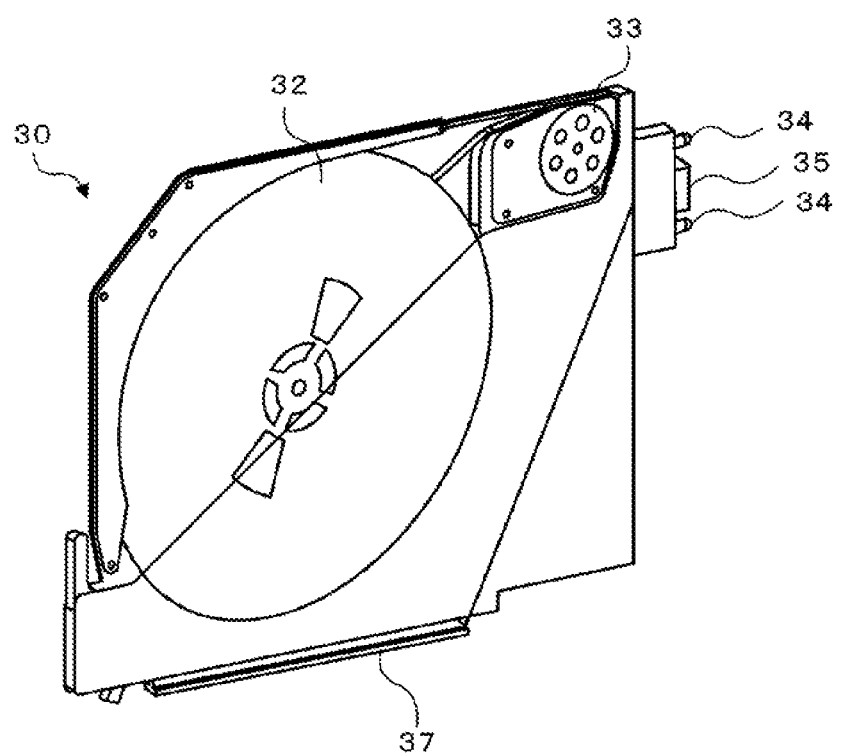
FIG. 3 is a diagram showing a schematic configuration of a feeder 30.
Figure 4:
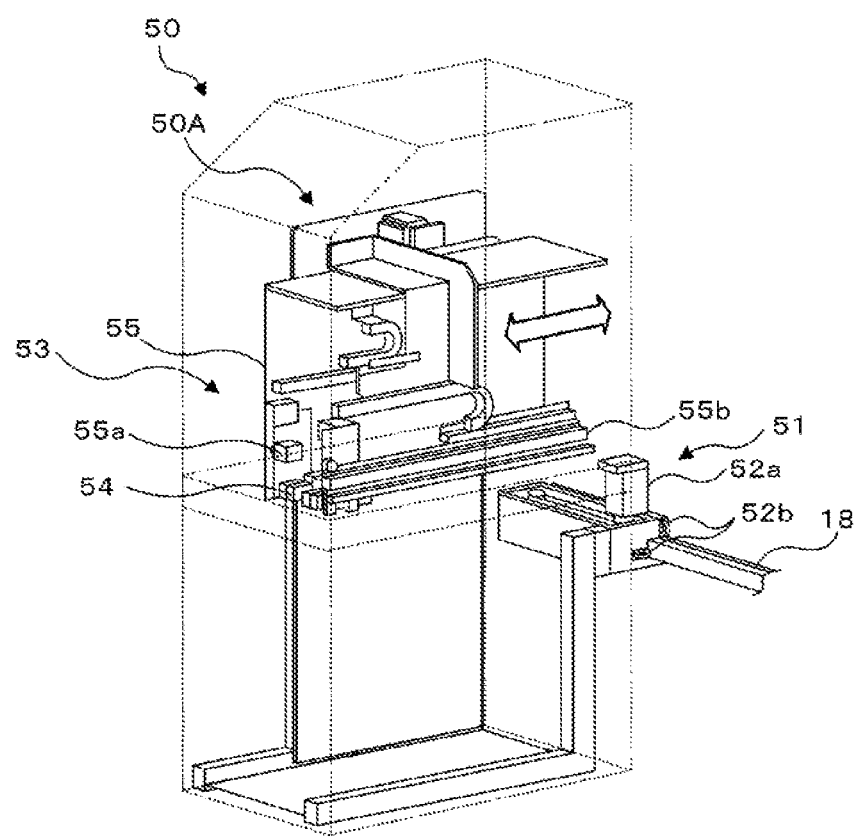
FIG. 4 is a diagram showing a schematic configuration of a first feeder moving robot 50.
Figure 5:
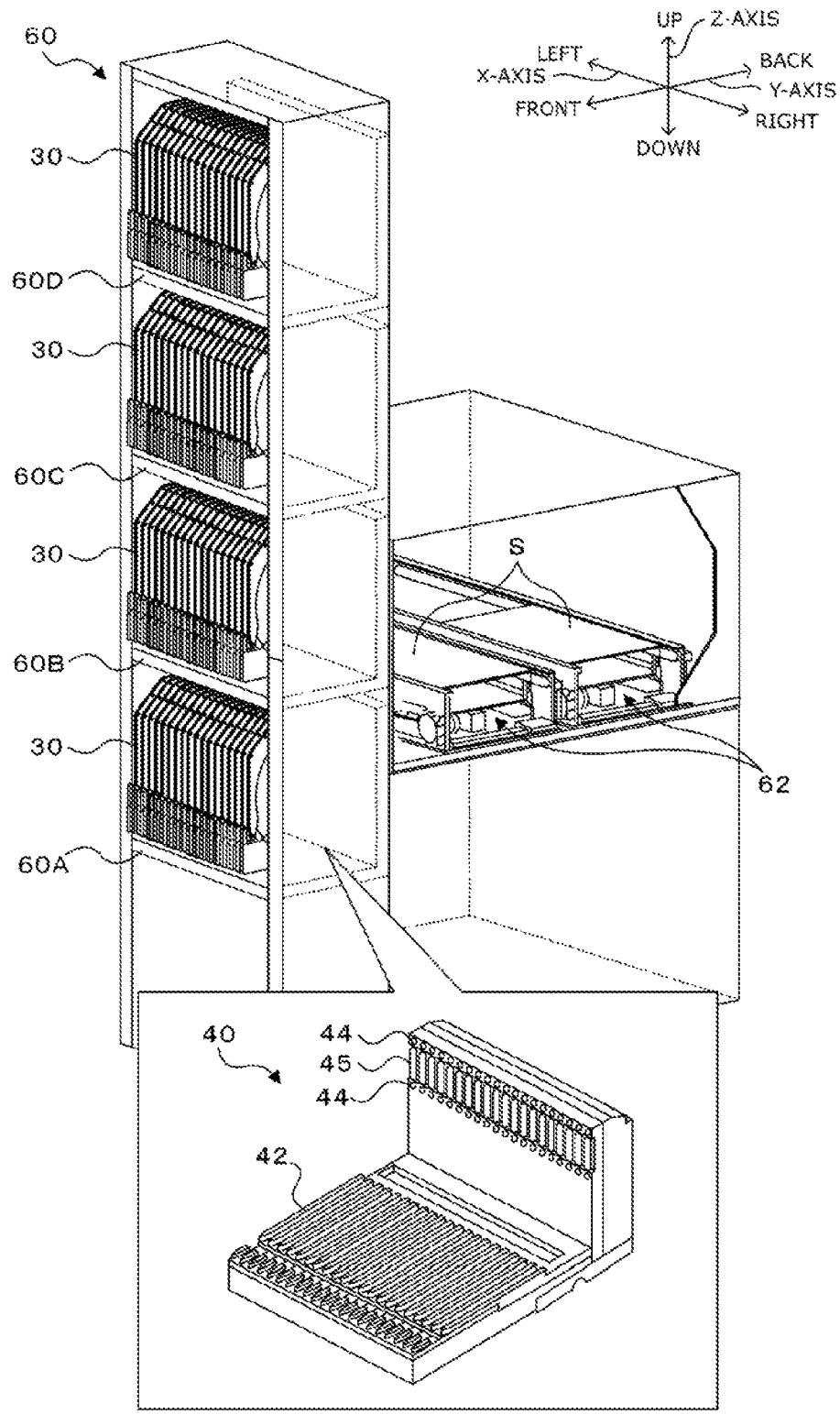
FIG. 5 is a diagram showing a schematic configuration of a feeder storage container 60.
Figure 6:
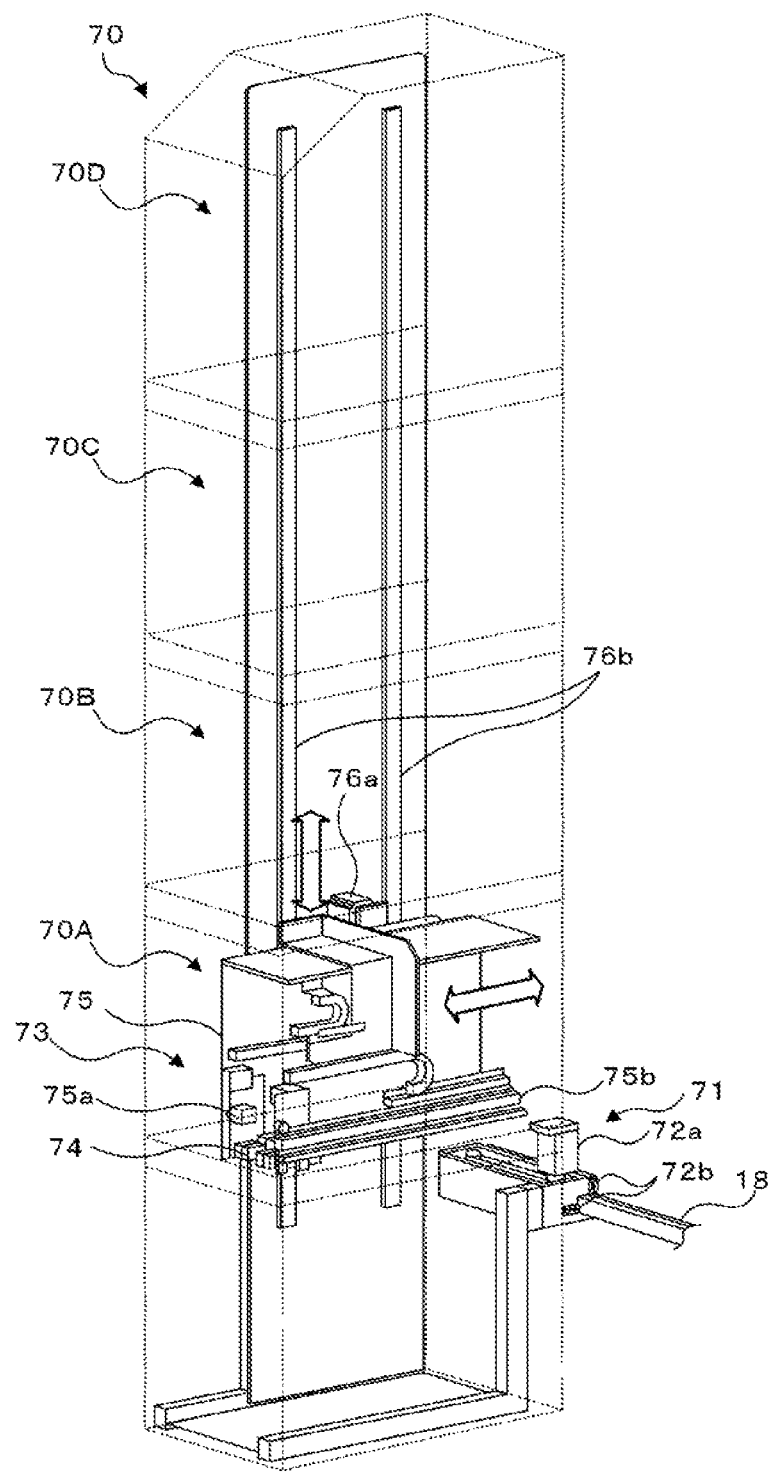
FIG. 6 is a diagram showing a schematic configuration of a second feeder moving robot 70.
Figure 7:
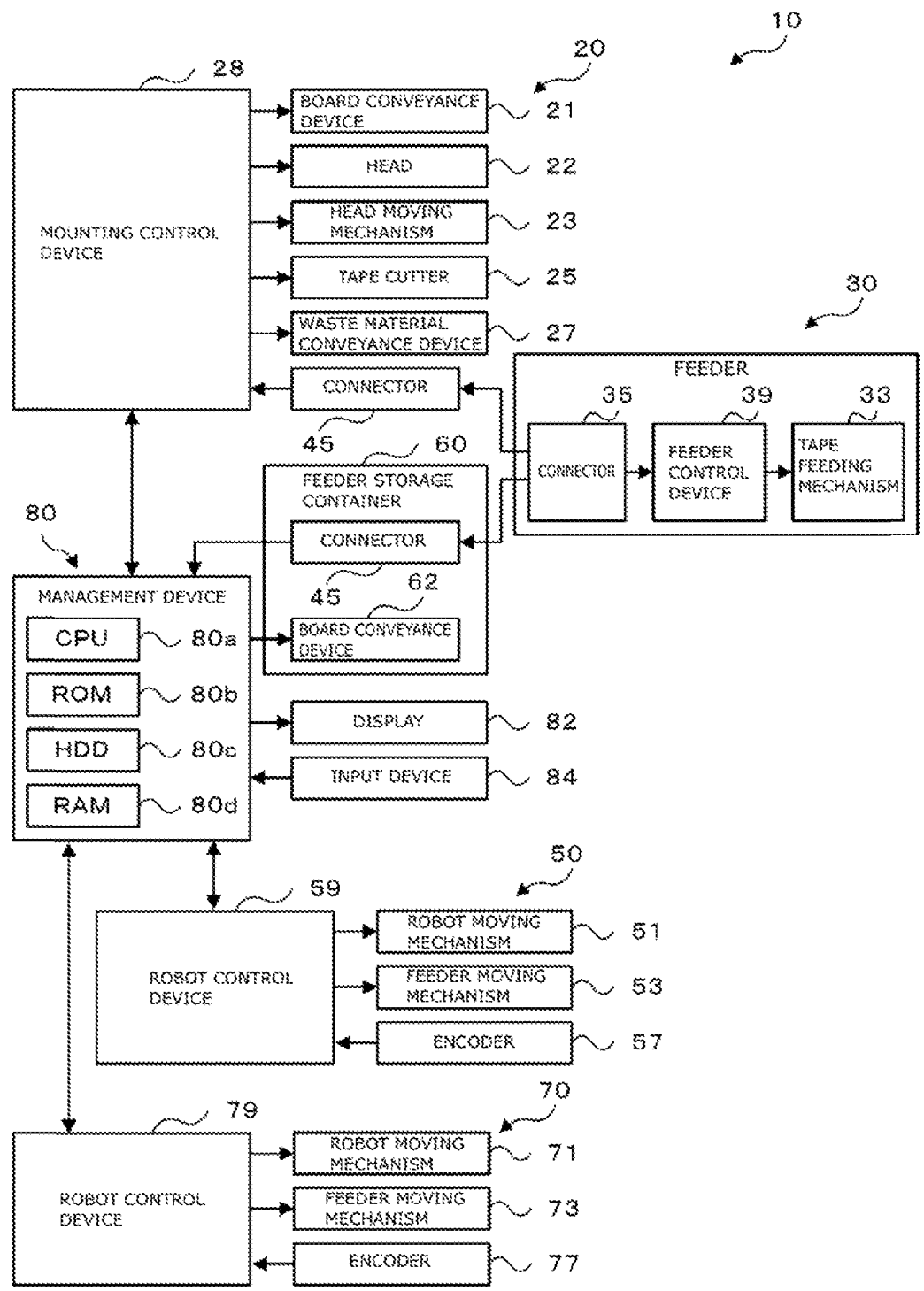
FIG. 7 is a configuration diagram related to control of the component-mounting system 10.

FIG. 1 is a diagram showing a schematic configuration of component-mounting system 10, FIG. 2 is a diagram showing a schematic configuration of component mounting machine 20, and FIG. 3 is a diagram showing a schematic configuration of feeder 30. FIG. 4 is a diagram showing a schematic configuration of first feeder moving robot 50, FIG. 5 is a diagram showing a schematic configuration of feeder storage container 60, FIG. 6 is a diagram showing a schematic configuration of second feeder moving robot 70, and FIG. 7 is a configuration diagram related to control of component-mounting system 10. Note that the left-right direction in FIG. 1 is the X-direction, the front-rear direction is the Y-direction, and the up-down is the Z-direction.

As shown in FIG. 1, component-mounting system 10 includes printing machine 12 that prints solder on a board, printing inspector 14 that inspects the state of the printed solder, multiple component mounting machines 20, each of which mounts components supplied from feeder 30 onto board S, a mounting inspector (not shown) that inspects the mounting state of the components, feeder storage container 60 that can store multiple feeders 30 in multiple stages, management device 80 that manages the entire system, and the like. The printing machine 12, the printing inspector 14, and the multiple component mounting machines 20 in the component-mounting system 10 are arranged in this order in the conveyance direction (i.e., the X-direction) of the circuit board S. Feeder storage container 60 is built into the line of component-mounting system 10, and is installed between the most upstream component mounting machine 20, in the board conveyance direction, among multiple component mounting machines 20 and printing inspector 14. That is, feeder storage container 60 is installed upstream from the most upstream component mounting machine 20. In the present embodiment, the operator supplies feeder 30 to feeder storage container 60 or collects feeder 30 from feeder storage container 60. Supplying and collecting of feeder 30 to and from feeder storage container 60 is also referred to as carrying in and out of feeder 30.

Component-mounting system 10 further includes first feeder moving robot 50 for moving feeder 30 between multiple component mounting machines 20 and the lowest stage of feeder storage container 60, and second feeder moving robot 70 for moving feeder 30 within feeder storage container 60. First feeder moving robot 50 is movable along X-axis rail 18 provided on the front surface of multiple component mounting machines 20 and the front surface of feeder storage container 60 in parallel with the board conveyance direction (i.e., the X-direction). Second feeder moving robot 70 is disposed upstream from first feeder moving robot 50 and is movable along the same X-axis rail 18. In FIGS. 2 and 5, X-axis rail 18 is not shown.

As shown in FIG. 2, component mounting machine 20 includes board conveyance device 21 for transporting board S in the X-direction, head 22 having a suction nozzle for picking up components supplied by feeder 30, head moving mechanism 23 for moving head 22 in the XY-directions, and mounting control device 28 (see FIG. 7) for controlling the entire device. The mounting control device 28 is configured by conventional CPU, ROM, RAM, and the like, and outputs drive signals to the board conveyance device 21, the head 22, the head moving mechanism 23, and the like.

Feeder 30 is configured as a tape feeder that feeds a component by feeding tape that accommodates the component at a predetermined pitch. As shown in FIG. 3, feeder 30 includes tape reel 32 on which tape is wound, tape feeding mechanism 33 for drawing and feeding the tape from tape reel 32, connector 35 having two positioning pins 34 protruding in the attachment direction, rail member 37 disposed at the lower end, and feeder control device 39 for controlling the entire feeder (see FIG. 7). Feeder control device 39 includes a well-known CPU, ROM, RAM, and the like, and outputs a drive signal to tape feeding mechanism 33. Feeder control device 39 can communicate with a control unit (e.g., mounting control device 28 or management device 80) to which feeder 30 is attached via connector 35.

As shown in FIG. 2, component mounting machine 20 has a component supply area in which feeder 30 can be attached to the front and a component can be supplied from feeder 30. The component supply area is provided with attachable feeder table 40 arranged in the X-direction so that feeders 30 are aligned in the X-direction. Feeder table 40 is an L-shaped table when viewed from the side, and includes slot 42 into which rail member 37 of feeders 30 can be inserted, two positioning holes 44 into which two positioning pins 34 of feeder 30 can be inserted, and connector 45, provided between two positioning holes 44, to which connector 35 is connected.

As shown in FIG. 4, first feeder moving robot 50 includes robot moving mechanism 51 for moving first feeder moving robot 50 along X-axis rail 18, feeder moving mechanism 53 for moving feeder 30 to component mounting machine 20 or feeder storage container 60, and robot control device 59 (see FIG. 7) for controlling the entire robot. Robot moving mechanism 51 includes X-axis motor 52a such as a servo motor for driving a drive belt for moving first feeder moving robot 50, guide roller 52b for guiding the movement of first feeder moving robot 50 along X-axis rail 18, and the like. Feeder moving mechanism 53 includes Y-axis slider 55 on which clamp section 54 for clamping feeder 30 and Y-axis motor 55a for moving clamp section 54 along Y-axis guide rail 55b are installed. First feeder moving robot 50 further includes encoder 57 (see FIG. 7) for detecting a moving position in the X-direction, and left-right monitoring sensors (not shown), such as infrared sensors, for monitoring the presence or absence of obstacles to (i.e., workers) to the left and right.

Y-axis slider 55 of feeder moving mechanism 53 is driven by Y-axis motor 55a to move between supply area 20A of component mounting machine 20 (see FIG. 2) and moving area 50A lacing supply area 20A. Robot control device 59 drives X-axis motor 52a to move first feeder moving robot 50 to a position facing component mounting machine 20, and then moves Y-axis slider 55, clamping feeder 30 by clamp section 54, from moving area 50A to supply area 20A by driving Y-axis motor 55a to insert rail member 37 of feeder 30 into slot 42 of feeder table 40 for releasing the clamp of clamp section 54, thereby attaching feeder 30 to feeder table 40 of supply area 20A. Robotic control device 59 also clamps feeder 30 mounted on feeder table 40 of supply area 20A with clamp section 54 to move Y-axis slider 55 from supply area 20A to moving area 50A by driving Y-axis motor 55a, thereby removing feeder 30 from feeder table 40 of supply area 20A (i.e., pulling it into moving area 50A).

As shown in FIG. 5, feeder storage container 60 has four storage areas 60A to 60D arranged in the up-down direction (i.e., the Z-direction) to which feeder 30 can be attached. Each storage area 60A to 60D is capable of accommodating multiple feeders 30 and is provided with feeder table 40 having the same configuration as that of feeder table 40 provided in supply area 20A of component mounting machine 20. Feeder table 40 of the lowest storage area 60A of storage areas 60A to 60D is provided at the same height (i.e., position in the Z-direction) as feeder table 40 of supply area 20A. Therefore, robot control device 59 of first feeder moving robot 50 can attach feeder 30 to feeder table 40 of storage area 60A by moving Y-axis slider 55, clamping feeder 30 with clamp section 54, from moving area 50A to storage area 60A by driving Y-axis motor 55a, inserting rail member 37 of feeder 30 into slot 42 of feeder table 40 for releasing the clamp of clamp section 54. Further, robot control device 59 can remove feeder 30 from feeder table 40 of storage area 60A (i.e., draw it into moving area 50A) by clamping feeder 30 attached to feeder table 40 of storage area 60A with clamp section 54 and moving Y-axis slider 55 from storage area 60A to moving area 50A by driving Y-axis motor 55a. That is, first feeder moving robot 50 can attach and detach feeder 30 to and from feeder table 40 in storage area 60A of feeder storage container 60 by the same operation as attaching and detaching feeder 30 to and from feeder table 40 in supply area 20A of component mounting machine 20. Feeder storage container 60 can accommodate feeder 30 that is scheduled to be used, or can accommodate used feeder 30 that has no remaining components.

As shown in FIG. 6, second feeder moving robot 70 includes robot moving mechanism 71 for moving second feeder moving robot 70 along X-axis rail 18, feeder transfer mechanism 73 for moving feeder 30 to feeder storage container 60, and robot control device 79 (see FIG. 7) for controlling the entire robot. Robot moving mechanism 71 includes X-axis motor 72a, such as a servo motor, for driving a drive belt for moving second feeder moving robot 70, guide roller 72b for guiding the movement of second feeder moving robot 70 along X-axis rail 18, and the like. Feeder moving mechanism 73 includes Y-axis slider 75 on which clamp section 74 for clamping feeder 30 and Y-axis motor 75a for moving clamp section 74 along Y-axis guide rail 75b are installed, and Z-axis motor 76a for moving Y-axis slider 75 along Z-axis guide rail 76b. Second feeder moving robot 70 further includes encoder 77 (see FIG. 7) for detecting a moving position in the X-direction, and left-right monitoring sensors (not shown), such as infrared sensors, for monitoring the presence or absence obstacles (i.e., workers) to the left and right.

Y-axis slider 75 of feeder moving mechanism 73 moves between moving areas 70A to 70D by the drive of Z-axis motor 76a and moves between each of moving areas 70A to 70D and storage areas 60A to 60D facing moving areas 70A to 70D by the drive of Y-axis motor 75a. Robot control device 79 can move clamp section 74 to any one of moving areas 70A to 70D by driving Z-axis motor 76a. Similarly to robot control device 59, robot control device 79 can attach feeder 30, being clamped with clamp section 74, to feeder table 40 of opposing storage areas 60A to 60D at any position of moving areas 70A to 70D by driving Y-axis motor 75a, whereby robot control device 79 can clamp and remove feeder 30, being attached to feeder table 40 of any of storage areas 60A to 60D, from feeder table 40.

In this manner, the first feeder moving robot 50 can attach and remove the feeder 30 only to the storage area 60A at the lowest stage of the feeder storage container 60 but can attach and remove the feeder 30 to and from the supply areas 20A of all the component mounting machines 20. On the other hand, since second feeder moving robot 70 is disposed upstream from first feeder moving robot 50, second feeder moving robot 70 cannot attach and remove feeder 30 from supply areas 20A of component mounting machines 20 but can attach and remove feeder 30 from all storage areas 60A to 60D of feeder storage container 60.

Further, board conveyance device 62 for conveying board S in the X-direction is disposed behind feeder storage container 60. Board conveyance device 62 is in the same position in the front-rear direction and the up-down direction as the board conveyance device (not shown) of printing inspector 14 and board conveyance device 21 of adjacent component mounting machine 20. As a result, board conveyance device 62 can convey board S received from the board conveyance device of printing inspector 14 and deliver it to board conveyance device 21 of adjacent component mounting machine 20.

As shown in FIG. 7, management device 80 is composed of well-known CPU 80a, ROM 80b, HDD 80c, RAM 80d, and the like, and includes display 82, such as an LCD, and inputting devices 84, such as a keyboard and mouse. Management device 80 stores a production program and the like for board S. The production program for board S is a program that determines which components are mounted on which board S and how many boards S mounted in such a manner are to be manufactured. Management device 80 is communicably connected by wire to mounting control device 28, is communicably connected wirelessly to robot control devices 59 and 79, and is also communicably connected to printer 12, printing inspector 14, and each control device of the mounting inspector. Management device 80 receives information about the mounting state of component mounting machine 20 from mounting control device 28, receives information about the driving state of first feeder moving robot 50 from robot control device 59, and receives information about the driving state of second feeder moving robot 70 from robot control device 79. The management device 80 of the present embodiment also manages the feeder storage container 60. Management device 80 is communicably connected to feeder control device 39 of feeder 30 attached to feeder table 40 of storage areas 60A to 60D via connectors 35 and 45. Further, management device 80 outputs a drive signal to board conveyance device 62 installed at the rear of feeder storage container 60 and causes board conveyance device 62 to move board S. Management device 80 receives a detection signal from a pre-storage-space monitoring sensor (not shown), such as an infrared sensor, for monitoring the presence of a worker in a predetermined area in front of feeder storage container 60.

Figure 8:
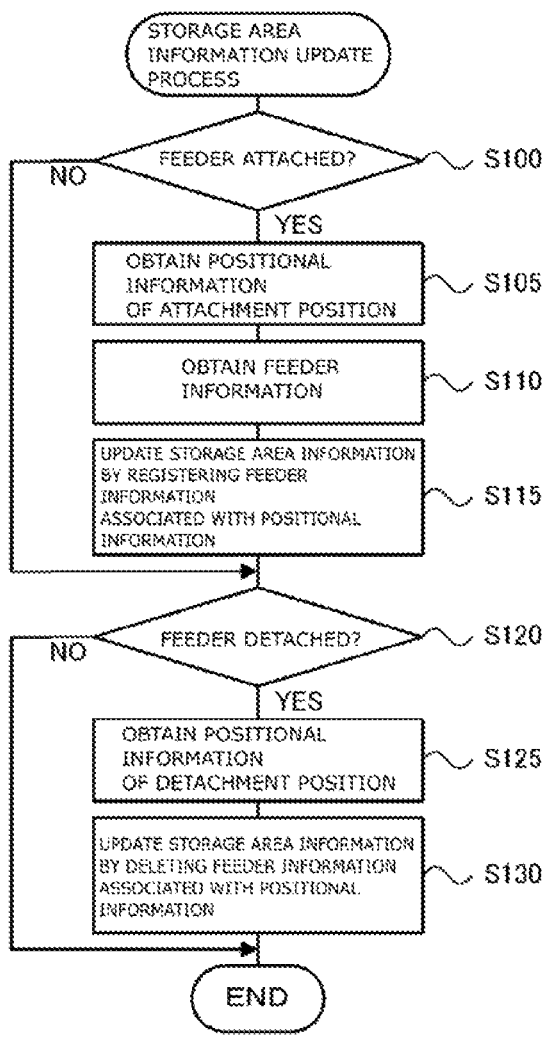
FIG. 8 is a flowchart showing an example of a storage area information update process.
Figure 9:
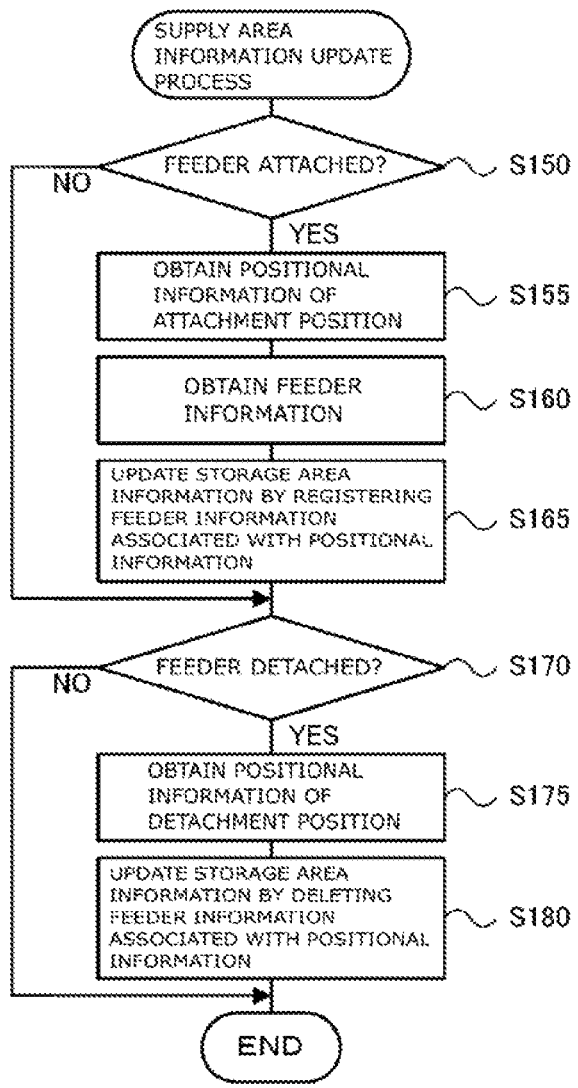
FIG. 9 is a flowchart showing an example of a supply area information update process.

Next, the operation of component-mounting system 10 configured as described above, in particular, the operation of management device 80 will be described. FIG. 8 is a flowchart showing an example of a storage area information update process, and FIG. 9 is a flowchart showing an example of a supply area information update process. The storage area information includes the attachment position of feeder 30 stored in feeder storage container 60 and feeder information related to the feeder 30, and the storage area information is stored in HDD 80c. The supply area information includes the mounting position of the feeder 30 set in the component mounting machine 20 and the above-described feeder information, and is stored in the HDD 80c.

In the storage area information updating process of FIG. 8, first, CPU 80a of management device 80 determines whether feeder 30 is newly attached to any of feeder tables 40 in any of storage areas 60A to 60D of feeder storage container 60 (step S100). When it is determined that feeder 30 is newly attached, CPU 80a obtains positional information of the attachment position based on the position of attached connector 45 (S105) and obtains feeder information, such as the ID information of feeder 30, the type of the accommodated component, and the remaining quantity of the component from feeder control device 39 of attached feeder 30 (S110). In step S115, CPU 80a updates the storage area information by registering the feeder information in HDD 83 in association with the positional information and proceeds to step S120. If it is determined in S100 that feeder 30 is not newly attached, CPU 80a skips the processes of S105 to S115 and proceeds to the process of S120.

Next, CPU 80a of management device 80 determines whether feeder 30 is detached from any of feeder tables 40 in any of storage areas 60A to 60D of feeder storage container 60 (S120), and if it is determined that feeder 30 is not detached, the storage area information updating process ends. On the other hand, when it is determined that feeder 30 has been removed, CPU 80a obtains the positional information of the removal position based on the position of detached connectors 45 (S125), updates the storage area information by deleting the feeder information associated with the positional information (S130), and ends the storage area information updating process.

In the supply area information updating process of FIG. 9, CPU 80a of management device 80 first determines whether feeder 30 is newly attached to any of feeder tables 40 of any of component mounting machines 20 of component-mounting system 10 (step S150). If it is determined that feeder 30 is newly attached, CPU 80a obtains positional information of the attachment position based on the position of attached connector 45 (S155) and obtains feeder information, such as the ID information of feeder 30, the type of the accommodated component, and the remaining quantity of the component from feeder control device 39 of attached feeder 30 (S160). CPU 80a then updates the feed area information by registering the feeder information in HDD 83 in association with the positional information (step S165), and proceeds to the process of step S170. If it is determined in S150 that feeder 30 is not newly attached, CPU 80a skips the process of S155 to S165 and proceeds to the process of S170.

Next, CPU 80a of management device 80 determines whether feeder 30 has been removed from any of feeder tables 40 of any of component mounting machines 20 of component-mounting system 10 (step S170), and if it is determined that feeder 30 has not been removed, CPU 80a ends the supply area information updating process. On the other hand, if it is determined that feeder 30 has been removed, CPU 80a obtains the positional information of the removal position based on the position of detached connectors 45 (S175), updates the supply area information by deleting the feeder information associated with the positional information (S180), and ends the supply area information updating process.

Figure 10:
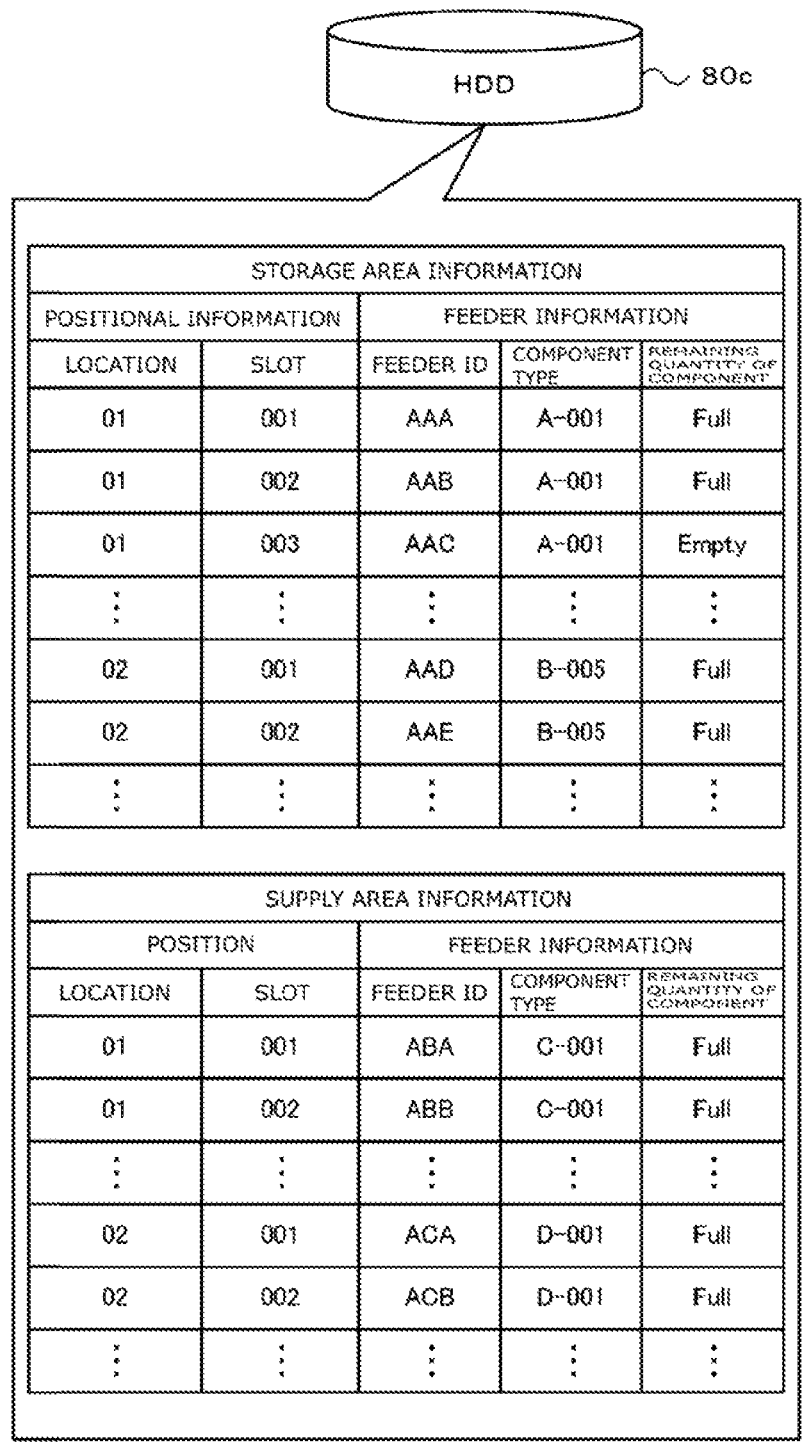
FIG. 10 is a diagram showing an example of storage area information and supply area information.

FIG. 10 is a diagram showing an example of storage area information and supply area information. In the storage area information, feeder 30 ID, component type, remaining quantity of components, and the like are stored in association with positional information of the attachment of feeder 30 to feeder storage container 60. The positional information of the storage area information includes a location indicating which storage area 60A to 60D of feeder storage container 60 feeder 30 is stored in and a slot indicating feeder table 40 in the storage area feeder 30 is attached to. The locations are sequentially defined with the first position "01" as the lowest storage area 60A among multiple storage areas 60A to 60D. The slots are sequentially defined with the first slot "001" as the reference slot (for example, the leftmost slot 42) among multiple slots 42 of feeder table 40 in the same storage area. Further, in the supply area information, feeder 30 ID, component type, remaining quantity of components, and the like are stored in association with positional information of the attachment of feeder 30 to component mounting machine 20. The positional information of the supply area information includes locations indicating component mounting machine 20 of component-mounting system 10 which feeder 30 is attached to, and the slot of feeder table 40 in the component mounting machine which feeder 30 is attached to. The locations are sequentially defined with the lowest component mounting machine 20 of the line defined as the first position "01". The slots are sequentially defined with the first slot "001" as the reference slot (for example, the leftmost slot 42) among multiple slots 42 of feeder table 40 in component mounting machine 20.

In the storage area information shown in FIG. 10, feeder 30 having the component type "A-001" and the remaining component quantity "Full" (i.e., unused after the operator replenishes) is attached to the position where the location is "01" and the slot is "001" or "002", that is, the first slot at the left end of storage area 60A at the lowest stage of feeder storage container 60 or the second slot from the left in the storage area information. In the storage area information, the position where the location is "01" and the slot is "003", that is, at the third slot from the left of storage area 60A at the lowest stage of feeder storage container 60, indicates that feeder 30 having the component type "A-001" and the remaining component quantity "Empty" (which has already been used in component mounting machine 20) is attached to the storage area information. Further, the storage area information indicates that feeder 30 having the component type "B-005" and the remaining component quantity "Full" is attached to the position where the location is "02" and the slot is "001" or "002", that is, the first slot at the left end or the second slot from the left of storage area 60B at the second stage from the bottom of feeder storage container 60.

Further, in the supply area information, feeder 30 having the component type "C-001" and the remaining component quantity "Full" is attached to the position of the location "01" and the slot "001" or "002", that is, the first or second slot at the left end of component mounting machine 20 among multiple component mounting machines 20 constituting the line. Further, it is indicated that feeder 30 having the component type "D-001" and the remaining component quantity "Full" is attached to the first slot and the second slot at the leftmost slot of second component mounting machine 20 among multiple component mounting machines 20 having the locations of "02" and the slots of "001" and "002", i.e., the lines.

Note that the storage area information and the supply area information are not limited to the information of the remaining component quantity being "Full" or "Empty", rather it may also store information of the actual remaining component quantity. Further, management device 80 may visually display the storage area information and the supply area information on display 82 based on a request from the operator. Mounting control device 28 of each component mounting machine 20 may store supply area information corresponding to each component mounting machine 20.

Figure 11:
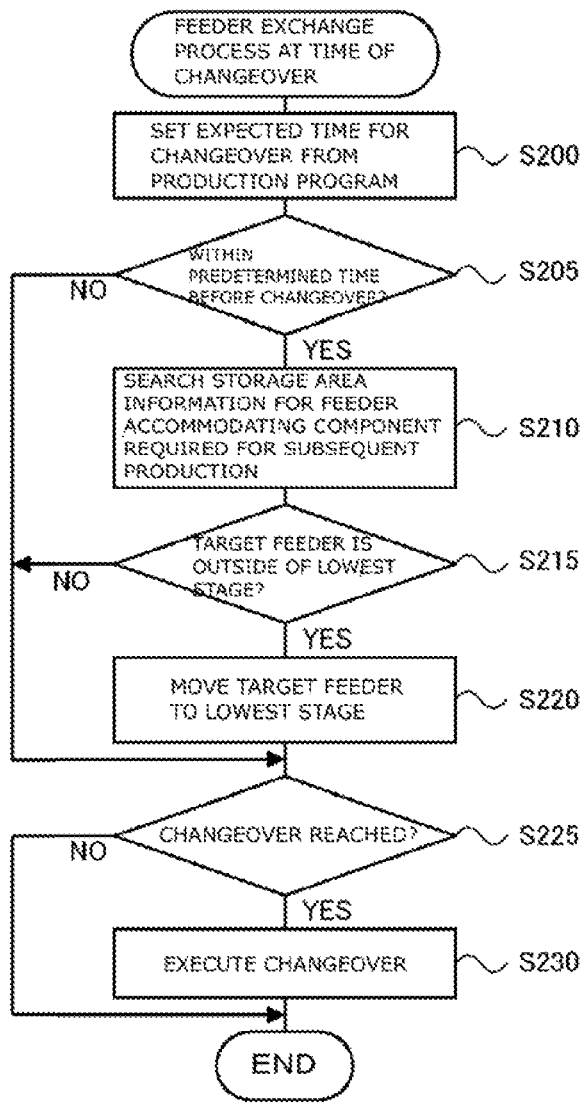
FIG. 11 is a flowchart showing an example of a feeder exchange process at the time of changeover.

FIG. 11 is a flowchart showing an example of a feeder exchange process at the time of changeover. This process is repeatedly executed at predetermined intervals, for example, every several seconds, by CPU 80a of management device 80. When the feeder exchange process at the time of changeover is executed, CPU 80a of management device 80 first sets the time of the expected changeover based on a production program (i.e., a production schedule) (step S200) and determines whether the time is within a predetermined time (for example, within several minutes) before the expected changeover time is reached (step S205). Here, the predetermined time is the time required for the processing of step S220, which will be described later. If CPU 80a determines that the time is greater than or equal to the predetermined time before the expected changeover time is reached, the process proceeds to S225. On the other hand, if CPU 80a determines that the time is less than or equal to the predetermined time before reaching the expected changeover time, CPU 80a searches the storage area information of feeder 30 with accommodating the components required for subsequent manufacturing (step S210), and based on the positional information of feeder 30 being matched (i.e., the target feeder), CPU 80a determines whether the target feeder is stored in storage area 60B to 60D other than storage area 60A of the lowest stage (i.e., the specific stage) of feeder storage container 60 (step S215). If CPU 80a determines that the target feeder is not stored in storage area 60B to 60D other than storage area 60A, the process proceeds to S225. On the other hand, when CPU 80a determines that the target feeder is stored in storage area 60B to 60D other than storage area 60A, CPU 80a transmits a control command to second feeder moving robot 70 so that the target feeder moves to the lowest storage area 60A in step S220 and proceeds to the process of step S225. When first feeder moving robot 50 is at a position where it interferes with the movement of second feeder moving robot 70, CPU 80a transmits a control command to first feeder moving robot 50 so that first feeder moving robot 50 moves to a retracted position.

Next, CPU 80a determines whether the changeover time has been reached (step S225). If CPU 80a determines that the changeover time has not been reached, CPU 80a ends the changeover feeder change process once. On the other hand, if it is determined that the changeover time has been reached, CPU 80a removes feeder 30 (i.e., the used feeder) accommodating components unnecessary for the next production from feeder table 40 of component mounting machine 20, attaches the feeder to empty feeder table 40 of feeder storage area 60A of feeder storage container 60 and transmits a control command to first feeder moving robot 50 (step S230) so that the changeover to mount the subject feeder section mounted on feeder table 40 of storage area 60A to feeder table 40 to be mounted on mounting machine 20 is executed (step S230), and completes the feeder replacement process at the time of the changeover. If second feeder moving robot 70 is at a position where it interferes with the movement of first feeder moving robot 50, CPU 80a transmits a control command to second feeder moving robot 70 so that second feeder moving robot 70 moves to a retracted position.

Figure 12:
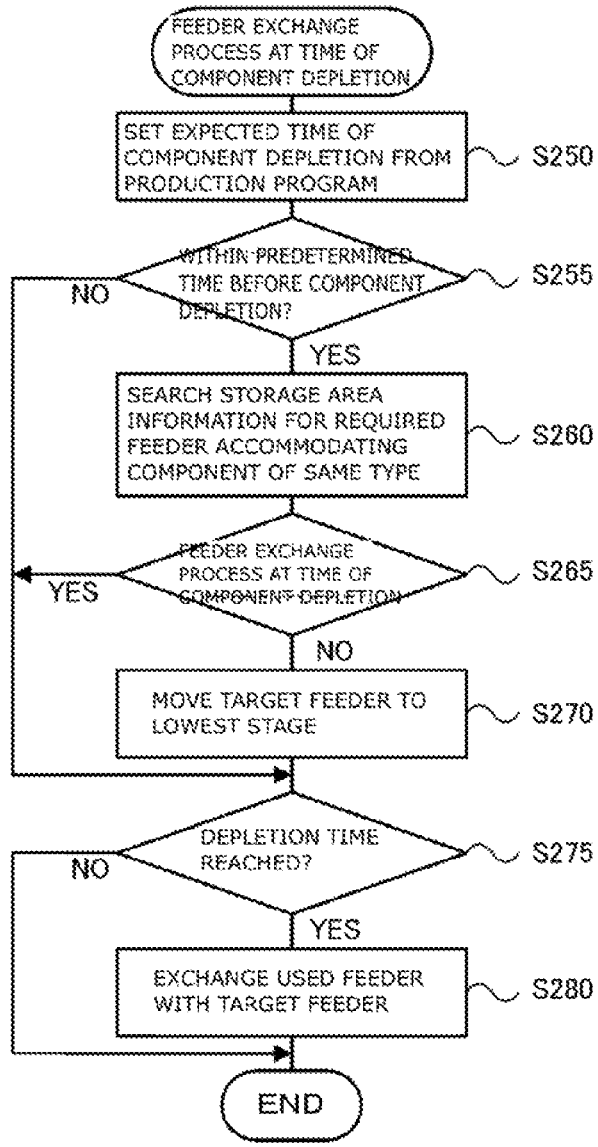
FIG. 12 is a flowchart showing an example of a feeder exchange process at the time of component depletion.

FIG. 12 is a flowchart showing an example of a feeder exchange process at the time of component depletion. This process is repeatedly executed at predetermined intervals, for example, every several seconds, by CPU 80a of management device 80. When the feeder exchange process is executed at the time of component depletion, CPU 80a of management device 80 first sets an expected time of depletion for each feeder 30 attached to feeder table 40 of component mounting machine 20 based on a production program (i.e., a production schedule) (step S250) and determines whether there is a feeder present within a predetermined time (for example, within several minutes) before the expected time of depletion is reached (step S255). Here, the predetermined time is a time required for the process of step S270, which will be described later. If CPU 80a determines that feeder 30 is not present within the predetermined time before the expected time of depletion is reached, the process proceeds to S275. On the other hand, if CPU 80a determines that feeder 30 is present within the predetermined time before the expected time of component depletion is reached, CPU 80a searches the storage area information of feeder 30 with accommodating the same type of component as the components accommodated by aforementioned feeder 30 (step S260), and based on the positional information of feeder 30 being matched (i.e., the target feeder), CPU 80a determines whether the target feeder is stored in storage area 60B to 60D other than storage area 60A of the lowest stage (i.e., the specific stage) of feeder storage container 60 (step S265). If CPU 80a determines that the target feeder is not stored in storage area 60B to 60D other than storage area 60A, the process proceeds to S275. On the other hand, when CPU 80a determines that the target feeder is stored in storage area 60B to 60D other than storage area 60A, CPU 80a transmits a control command to second feeder moving robot 70 so that the target feeder moves to the lowest storage area 60A (step S270), and proceeds to the process of step S275. When first feeder moving robot 50 is at a position where it interferes with the movement of second feeder moving robot 70, CPU 80a transmits a control command to first feeder moving robot 50 so that first feeder moving robot 50 moves to a retracted position.

Next, CPU 80a determines whether the component depletion time has been reached (step S275). If it is determined that the component depletion time has not been reached, CPU 80a ends the component depletion time feeder exchange process. On the other hand, if it is determined that the component depletion time has been reached, CPU 80a removes feeder 30 (i.e., the used feeder) for which the component depletion has occurred from feeder table 40 of component mounting machine 20, attaches the feeder to empty feeder table 40 of feeder storage area 60A of feeder storage container 60 and transmits a control command to first feeder moving robot 50 to attach the target feeder attached on feeder table 40 of storage area 60A to feeder table 40 to be attached to mounting machine 20 (step S280), and completes the feeder exchange process at the component depletion time. If second feeder moving robot 70 is at a position where it interferes with the movement of first feeder moving robot 50, CPU 80a transmits a control command to second feeder moving robot 70 so that second feeder moving robot 70 moves to a retracted position.

Figure 13:
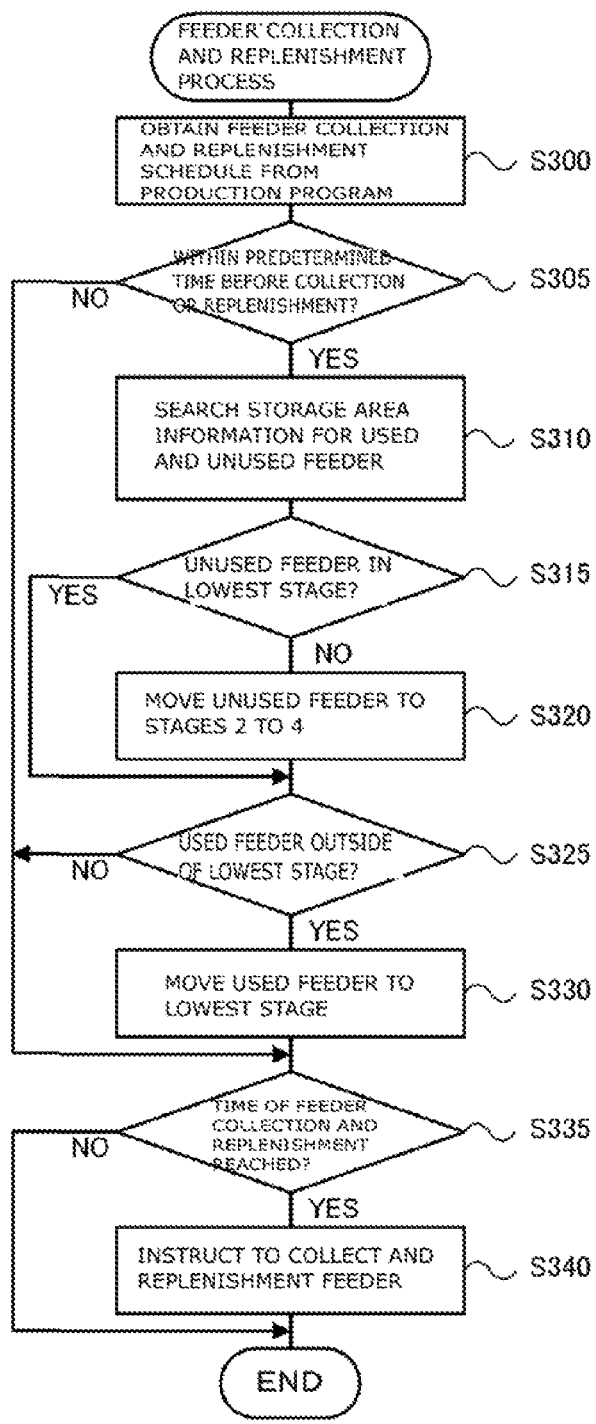
FIG. 13 is a flowchart showing an example of a feeder collection and replenishment process.

FIG. 13 is a flowchart showing an example of the feeder collection and replenishment process. This process is repeatedly executed at predetermined intervals, for example, every several seconds, by CPU 80a of management device 80. When the feeder collection and replenishment process is executed, CPU 80a of management device 80 first sets a feeder collection and replenishment time based on a production program (i.e., a production schedule) (step S300) and determines whether the time is within a predetermined time (for example, within several minutes) before the feeder collection and replenishment time is reached (step S305). Here, the predetermined time is a time required for the process of steps S310 and S320, which will be described later. If CPU 80a determines that the time is not within the predetermined time before the feeder collection and replenishment time, the process proceeds to step S335. On the other hand, if it is determined that the time is within the predetermined time before the feeder collection and replenishment time has been reached, CPU 80a searches for an unused feeder and a used feeder from the storage area information (step S310). CPU 80a then determines whether there is an unused feeder attached to storage area 60A at the lowest stage (i.e., the specified stage) of feeder storage container 60 (step S315). If CPU 80a determines that there are no unused feeders attached to storage area 60A, the process proceeds to step S325. On the other hand, when CPU 80a determines that there is an unused feeder attached to storage area 60A, it transmits a control command to first feeder moving robot 50 to remove the unused feeder and attach the unused feeder to free feeder table 40 in any of storage areas 60B to 60D of the second to fourth stages other than the lowest stage (step S320) and proceeds to the process of step S325. Next, CPU 80a determines whether there are used feeders attached to storage areas 60B to 60D other than the lowest storage area 60A (step S325). If CPU 80a determines that there are no used feeders attached to storage areas 60B to 60D, the process proceeds to S335. On the other hand, when CPU 80a determines that there is a used feeder attached to storage areas 60B to 60D, CPU 80a removes the used feeder from feeder table 40 and transmits a control command to second feeder moving robot 70 to attach the used feeder to free feeder table 40 in the lowest storage area 60A (step S330) and proceeds to the process of step S335.

Next, CPU 80a determines whether the feeder collection and replenishment time has been reached (step S335), and if it is determined that the feeder collection and replenishment time has been reached, CPU 80a instructs the operator to collect and replenish feeder 30 for feeder storage container 60 (i.e., storage area 60A) (step S340) and ends the feeder collection and replenishment process.

Here, the correspondence between the configuration elements of the present embodiment and the constituent elements of the present disclosure will be clarified. Feeder 30 of the present embodiment corresponds to a "component supply unit", feeder table 40 corresponds to a "mounting section", component mounting machine 20 corresponds to a "component mounting machine", component-mounting system 10 corresponds to a "component-mounting system", feeder storage container 60 corresponds to a "unit storage container", first feeder moving robot 50 corresponds to a "first unit moving device", and second feeder moving robot 70 corresponds to a "second unit moving device". The storage area information and the supply area information correspond to "unit-related information", and management device 80 corresponds to a "management device".

Component-mounting system 10 described above includes: multiple component mounting machines 20 disposed along a board conveyance direction; feeder storage container 60 for storing multiples of feeders 30, which are capable of being attached/detached to and from component mounting machines 20, in each stage among multiple stages; first feeder moving robot 50 capable of exchanging feeder 30 between the lowest stage (i.e., specific stage) among multiple stages of feeder storage container 60 and the component mounting machine 20; and second feeder moving robot 70 capable of exchanging feeder 30 between the lowest stage (i.e., a specific stage) among multiple stages of feeder storage container 60 and the other stages (i.e., non-specified stages). As a result, the operator can automatically supply feeder 30 necessary for each component mounting machine 20 of component-mounting system 10 by simply collectively replenishing feeder 30 to feeder storage container 60. Further, since unnecessary feeder 30 can be automatically collected from each component mounting machine 20 into feeder storage container 60, the operator can collectively collect feeder 30 from feeder storage container 60. Moreover, since feeder storage container 60 is configured to store multiple feeders 30 in each stage, a large number of unused feeders and used feeders can be stored, and the number of replenishments and collections of feeders 30 to feeder storage container 60 can be reduced, thereby reducing the burden on the operator. As a result, it is possible to provide a high-productivity component-mounting system suitable for high-variety and low-volume production.

In the component-mounting system 10, since feeder table 40 at the lowest stage (i.e., the specific stage) of feeder storage container 60 and component mounting machine 20 are disposed at the same height, first feeder moving robot 50 can efficiently attach/detach feeder 30 between feeder storage container 60 and component mounting machine 20 using the same feeder moving mechanism 53.

In component-mounting system 10, feeder storage compartment 60 is disposed upstream from the most upstream component mounting machine 20, and second feeder moving robot 70 is disposed upstream from first feeder moving robot 50. As a result, it is possible to suppress second feeder moving robot 70 from interfering with the movement of first feeder moving robot 50.

It is to be understood that the present disclosure is not limited to the above-described embodiment and may be implemented in various modes provided they fall within the technical scope of the present disclosure.

For example, in the embodiment described above, feeder storage container 60 is installed upstream from the most upstream component mounting machine 20, but the present disclosure is not limited to this, and feeder storage container 60 may be installed downstream from the most downstream component mounting machine 20 in the direction in which multiple component mounting machines 20 are lined up. In this case, second feeder moving robot 70 may be disposed downstream from first feeder moving robot 50. Further, although only one feeder storage container 60 was installed in component-mounting system 10, multiple feeder storage containers 60 may be installed. In this case, multiple first feeder moving robots 50 may be installed.

Figure 14:
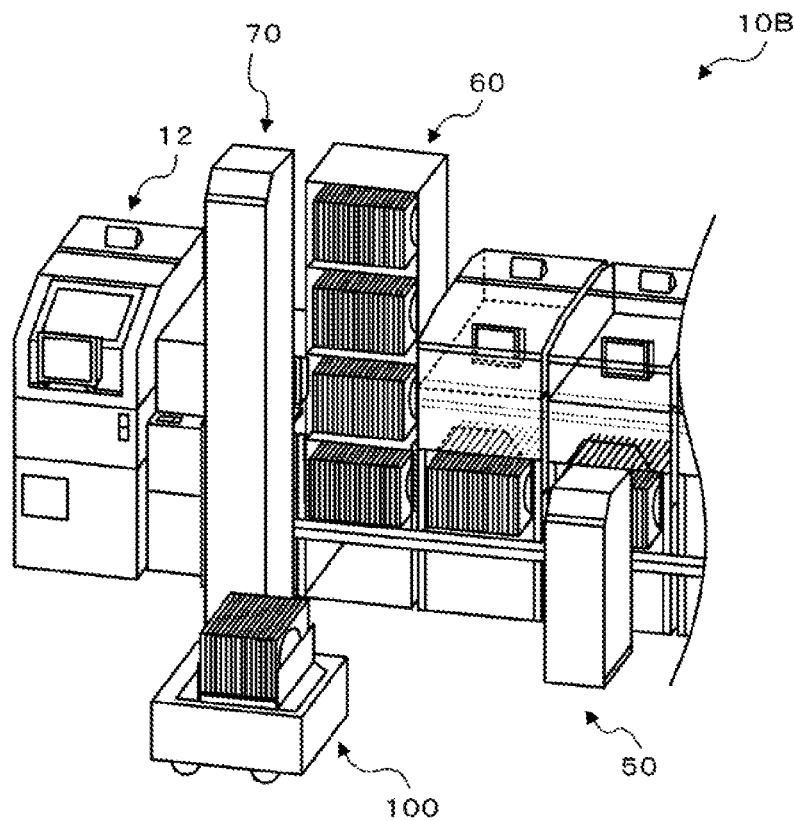
FIG. 14 is a diagram summarizing a configuration of a component-mounting system 10B according to a modification.

In the embodiment described above, the operator conveys feeder 30 into and out of feeder storage container 60, but the present disclosure is not limited to this, and feeder 30 may be conveyed into and out of feeder storage container 60 by utilizing an automatic conveyance device capable of automatically conveying feeder 30 from outside the line of component mounting machine 20. FIG. 14 is a diagram summarizing a configuration of component-mounting system 10B according to a modification. As shown in FIG. 14, AGV (Automated Guided Vehicle) 100 can be used as the automatic conveyance device. In this instance, if it is determined in step S335 of the feeder collection and replenishment process of FIG. 13 that the feeder collection and replenishment time has been reached, AGV 100 can carry feeder 30 into and out of storage area 60A at the lowest stage of feeder storage container 60.

In the above-described embodiment, the operator may convey the feeder 30 into and out of feeder storage container 60 one by one, or may convey multiple feeders 30 in and out collectively. For example, in storage area 60A of feeder storage container 60, a magazine in which multiple feeders 30 are configured as a set that can be collectively attached and detached. The operator then attaches multiple new feeders 30 to the magazine and replenishes the magazine to storage area 60A or collects the magazine when multiple used feeders 30 are attached to the magazine of storage area 60A. In this case, the operator may replenish or collect the magazine by using a wheeled table on which the magazine can be installed. Further, storage area 60A of feeder storage container 60 may be configured to set a wheeled table on which such a magazine is installed, and a work cart may replace each cart (including feeder 30 in the magazine on the wheeled table).

In the embodiment described above, the present disclosure is applied to a component-mounting system, but the present disclosure may be applied to a management device.

INDUSTRIAL APPLICABILITY

The present disclosure can be applied to the manufacturing industry of component-mounting systems and management devices.

Description of Reference Numerals 10, 10B component mounting line, 12 printer, 14 printing inspector, 18 X-axis rail, 20 component mounting machine, 20A supply area, 21 board conveyance device, 22 head, 23 head moving mechanism, 28 mounting control device, 30 feeder, 32 tape reel, 33 tape feeding mechanism, 34 positioning pin, 35 connector, 37 rail member, 39 feeder control device, 40 feeder table, 42 slot, 44 positioning hole, 45 connector, 50 first feeder moving robot, 51 robot moving mechanism, 52a X-axis motor, 52b guide roller, 53 feeder moving mechanism, 54 clamp section, 55a Y-axis slider, 55a Y-axis motor, 55b Y-axis guide rail, 57 encoder, 59 robot control device, 60 feeder storage container, 60A to 60D storage areas, 62 board conveyance device, 70 second feeder moving robot, 71 robot moving mechanism, 72a X-axis motor, 72b guide roller, 73 feeder moving mechanism, 74 clamp section, 75 Y-axis slider, 75a Y-axis motor, 75b Y-axis guide rail, 76a Z-axis motor, 76b Z-axis guide rail, 77 encoder, 79 robot control device, 80 management device, 80a CPU, 80b ROM, 80c HDD, 80d RAM, 82 display, 84 input device, 100 AGV, S board.

The invention claimed is:

1. A component-mounting system, comprising:
   multiple component mounting machines installed along a direction in which a mounting target object is conveyed, each component mounting machine mounting components supplied from component supply units to the mounting target object, and including a mounting section to which the component supply units are detachable;
   a unit storage container which is installed in a same line as that of the multiple component mounting machines, and includes multiple stages of mounting sections to which the component supply units are detachable;
   a first unit moving device for exchanging the component supply units between a specific mounting section of a specific stage from among multiple stages of the unit storage container and the mounting section of each component mounting machine; and
   a second unit moving device for exchanging the component supply units between the specific mounting section of the specific stage of the unit storage container and a non-specific mounting section of a non-specific stage from among multiple stages of the unit storage container, wherein
   the first moving unit and the second moving unit each movable along a rail on a front surface of the multiple component mounting machines.

2. The component-mounting system according to claim 1, wherein
   the second unit moving device mounts a component supply unit to be required for a subsequent production, onto the specific mounting section of the specific stage, the component supply unit being one of component supply units stored in the unit storage container, and wherein
   at a time of the subsequent production being performed, the first unit moving device replaces the component supply unit to be required for the subsequent production, which is mounted on the specific mounting section of the specific stage, with a used component supply unit which is mounted on the mounting section of the component mounting machine requiring the component supply unit to be required for the subsequent production.

3. The component-mounting system according to claim 1, wherein
   the second unit moving device controls a component supply unit among the component supply units stored in the unit storage container, such that the component supply unit, capable of supplying components of the same type as a component supply unit expected to be depleted of components, is mounted onto the specific mounting section of the specific stage, when any of the component supply units mounted on each mounting section of the multiple component mounting machines is expected to be depleted of components, and wherein
   the first unit moving device, at a time of component depletion, controls the component supply unit mounted on the specific mounting section of the specific stage such that the component supply unit is exchanged with the component supply unit, being mounted on a mounting section of any of the multiple component mounting machines, which is expected to be depleted of components.

4. The component-mounting system according to claim 1, wherein
   the second unit moving device causes a used component supply unit among the component supply units stored in the unit storage container to mount on the specific mounting section of the specific stage at a predetermined timing.

5. A component-mounting system, comprising:
   multiple component mounting machines installed along a direction in which a mounting target object is conveyed, each component mounting machine mounting components supplied from component supply units to the mounting target object, and including a mounting section to which the component supply units are detachable;
   a unit storage container which is installed in a same line as that of the multiple component mounting machines, and includes multiple stages of mounting sections to which the component supply units are detachable;
   a first unit moving device for exchanging the component supply units between the mounting section of a specific stage from among multiple stages of the unit storage container and the mounting section of each component mounting machine;
   a second unit moving device for exchanging the component supply units between the mounting section of the specific stage of the unit storage container and the mounting section of a non-specific stage different from the specific stage; and
   a management device for linking and storing unit-related supply area information obtained from a corresponding component mounting machine, the supply area information including:
      mounting positional information relating to mounting positions of component supply units mounted on each mounting section of the multiple component mounting machines,
      component type information relating to types of components that are supplied by the component supply unit, and remaining quantity information relating to a number of components remaining in the component supply unit; and the management device links and stores storage area information obtained from the unit storage container, the storage area information including:

mounting position information relating to mounting positions of component supply units mounted on each mounting section of the unit storage container, component type information relating to types of components that are supplied by the component supply unit of the unit storage container, and remaining quantity information relating to the number of components remaining in the component supply unit of the unit storage container.

6. The component-mounting system according to claim 5, wherein the management device may transmit a control command to the first unit moving device and the second unit moving device so that the component supply unit is exchanged between the specific stage and the non-specific stage of the unit storage container based on the supply area information and between the specific stage of the unit storage container and the multiple component mounting machines.

7. A management device for managing a component-mounting system, the component-mounting system comprising:

multiple component mounting machines installed along the direction in which a mounting target object is conveyed, wherein each component mounting machine mounts components supplied from component supply units to the mounting target object, each component mounting machine having a mounting section to which the component supply units can be detachable;

a unit storage container which is installed in the same line as the multiple component mounting machines and has multiple stages of mounting sections to which component supply units can be detachable;

a first unit moving device for exchanging the component supply units between the mounting section of a specific stage from among multiple stages of the unit storage container and the mounting section of each component mounting machine; and a second unit moving device for exchanging the component supply units between the mounting section of the specific stage of the unit storage container, wherein the management device links and stores supply area information obtained from a corresponding component mounting machine, the supply area information including:

mounting positional information relating to mounting positions of component supply units mounted on each mounting section of the multiple component mounting machines, component type information relating to types of components that can be supplied by the component supply unit, and remaining quantity information relating to a number of components remaining in the component supply unit; and the management device links and stores storage area information obtained from the unit storage container, the storage area information including:

mounting position information relating to mounting positions of component supply units mounted on each mounting section of the unit storage container, component type information relating to types of components that can be supplied by the component supply unit of the unit storage container, and remaining quantity information relating to the number of components remaining in the component supply unit of the unit storage container; and the management device transmits a control command to the first unit moving device and the second unit moving device so that the component supply unit is exchanged between the specific stage and a non-specific stage of the unit storage container based on the supply area information and between the specific stage of the unit storage container and the multiple component mounting machines.

* * * * *